United States Patent
Wen et al.

(10) Patent No.: US 10,055,631 B1
(45) Date of Patent: Aug. 21, 2018

(54) SEMICONDUCTOR PACKAGE FOR SENSOR APPLICATIONS

(71) Applicant: Synaptics Incorporated, San Jose, CA (US)

(72) Inventors: Shengmin Wen, Phoenix, AZ (US); Brett Dunlap, Gilbert, AZ (US); Jay Kim, Zhubei (TW)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 15/343,168

(22) Filed: Nov. 3, 2016

Related U.S. Application Data (60) Provisional application No. 62/250,347, filed on Nov. 3, 2015.

(51) Int. Cl.
| | | |
|---|---|---|
| H01L 23/48 | (2006.01) |
| H01L 23/52 | (2006.01) |
| H01L 29/40 | (2006.01) |
| G06K 9/00 | (2006.01) |
| H01L 23/538 | (2006.01) |
| H01L 23/00 | (2006.01) |
| H01L 23/498 | (2006.01) |

(52) U.S. Cl.
CPC ...... *G06K 9/0002* (2013.01); *H01L 23/49816* (2013.01); *H01L 23/5383* (2013.01); *H01L 23/5389* (2013.01); *H01L 24/19* (2013.01); *H01L 24/24* (2013.01); *H01L 2224/2402* (2013.01); *H01L 2224/2413* (2013.01); *H01L 2224/24247* (2013.01); *H01L 2224/24265* (2013.01)

(58) Field of Classification Search
CPC .................. H01L 23/5383; H01L 23/5389
See application file for complete search history.

(56) References Cited

U.S. PATENT DOCUMENTS

| | | | |
|---|---|---|---|
| 7,015,579 B2 | 3/2006 | Okada et al. |
| 7,793,550 B2 | 9/2010 | Elian et al. |
| 7,932,595 B1 | 4/2011 | Huemoeller et al. |
| 8,169,070 B2 | 5/2012 | Poeppel et al. |
| 8,298,866 B1 | 10/2012 | Huemoeller et al. |
| 8,716,613 B2 | 5/2014 | Perezselsky et al. |
| 2007/0069389 A1 | 3/2007 | Wollanke et al. |
| 2008/0009102 A1 | 1/2008 | Yang et al. |

(Continued)

OTHER PUBLICATIONS

Beesley, Mark, Sip Global Summit 2013, Embedded Component in Panel Production, Mar. 11, 2013.

(Continued)

*Primary Examiner* — Matthew Reames
*Assistant Examiner* — Wilner Jean Baptiste
(74) *Attorney, Agent, or Firm* — Leydig, Voit & Mayer, Ltd.

(57) ABSTRACT

A sensor package and a method of forming a sensor package are disclosed. The sensor package comprises: a multilayer substrate comprising a mold compound layer and a plurality of patterned metal layers; an embedded die embedded in the multilayer substrate, wherein the mold compound layer of the multilayer substrate surrounds the embedded die; and, a sensing element disposed over the multilayer substrate, the sensing element comprising a first patterned metal layer electrically connected to the embedded die through the multilayer substrate.

17 Claims, 8 Drawing Sheets

(56) References Cited

U.S. PATENT DOCUMENTS

| | | | |
|---|---|---|---|
| 2008/0064142 | A1 | 3/2008 | Gan et al. |
| 2009/0140394 | A1 | 6/2009 | Bathan et al. |
| 2009/0218698 | A1 | 9/2009 | Lam |
| 2010/0289095 | A1 | 11/2010 | Poeppel et al. |
| 2011/0304001 | A1 | 12/2011 | Erhart et al. |
| 2012/0256280 | A1 | 10/2012 | Erhart et al. |
| 2012/0300425 | A1* | 11/2012 | Nakashima ....... H01L 23/49838 361/761 |
| 2014/0103943 | A1* | 4/2014 | Dunlap ................ G01N 27/221 324/663 |
| 2014/0162407 | A1 | 6/2014 | Zwenger et al. |
| 2014/0333328 | A1 | 11/2014 | Nelson et al. |
| 2017/0061187 | A1* | 3/2017 | Wen ..................... G06K 9/0002 |

OTHER PUBLICATIONS

Beesley, Mark, 3D Component Packaging in Organic Substrate Embedded Technology, Apr. 2012.

Beesley, Mark, 3D Component Packaging in Organic Substrate Embedded Component, 2012.

Vardaman, E. Jan, Directions in Mobile Device Packaging, IEEE Components, Packaging and Manufacturing Technology Chapter, SCV, Mar. 27, 2012.

Fan, Xuejun, and Qiang Han. "Design and reliability in wafer level packaging." *Electronics Packaging Technology Conference, 2008. EPTC 2008. 10th.* IEEE, 2008.

IFTLE 26 Advance Packaging at the 2010 ESTC, downloaded from internet Aug. 26, 2015.

Pendse, Dr. Raj, eWLB: A Transformative Fan-out Packaging Technology for High Performance, Integration and Small Form Factors, Jun. 2011.

MEPTEC Report, vol. 15, No. 3, Fall 2011.

Ing. Jiří Starý, Packaging for Modern Electronic Applications, Oct. 17, 2011.

Lee, SeungJae, et al. "Electrical evaluation of wafer level fan out (WLFO) package using organic substrates for microwave applications." *Electronic System-Integration Technology Conference (ESTC), 2010 3rd.* IEEE, 2010.

Meyer, T., et al. "System Integration with eWLB." *Electronic System-Integration Technology Conference (ESTC), 2010 3rd.* IEEE, 2010.

Boettcher, Lars, et al. "Embedding of chips for system in package realization-technology and applications." *Microsystems, Packaging, Assembly & Circuits Technology Conference, 2008. Impact 2008. 3rd International.* IEEE, 2008.

Zwenger, Curtis, et al. "Silicon Wafer Integrated Fan-out Technology." *Additional Papers and Presentations* 2015.DPC (2015): 000217-000247.

Jin, Yonggang, et al. "Advanced packaging solutions of next generation eWLB technology." *Electronics Packaging Technology Conference (EPTC), 2011 IEEE 13th.* IEEE, 2011.

Jin, Yonggang, et al. "Next generation eWLB (embedded wafer level BGA) packaging." *Electronics Packaging Technology Conference (EPTC), 2010 12th.* IEEE. 2010.

Yoon, Seung Wook, Yaojian Lin. and Pandi C. Marimuthu. "Development and characterization of 300mm large panel eWLB (embedded wafer level BGA)." *Microelectronics and Packaging Conference (EMPC), 2011 18th European.* IEEE, 2011.

Yoon, Seung Wook, et al. "3D eWLB (embedded wafer level BGA) Technology: Dawn of a New Age of Thin and 3D Package Technology." *International Wafer Level Packaging Conference Proceedings*, Nov. 5, 2011.

\* cited by examiner

SEMICONDUCTOR PACKAGE FOR SENSOR APPLICATIONS

CROSS-REFERENCE TO RELATED APPLICATIONS

This application claims the benefit of U.S. Provisional Application No. 62/250,347, filed on Nov. 3, 2015, which is hereby incorporated by reference in its entirety.

TECHNICAL FIELD

This application relates to semiconductor packaging and, more particularly, to capacitive fingerprint sensor packaging.

BACKGROUND

Fingerprint sensor devices are often used to enhance the security and usability of many electronic devices. Fingerprint sensor devices typically include a sensing array for capturing the fingerprint, as well as a controller die for operating and measuring signals from the sensing array. When the controller die and the sensing array are provided as separate components, packaging the sensor can be a difficult and costly process, and the cost and performance of the final sensor device is affected by the method of formation and the construction of the resulting semiconductor package.

SUMMARY

One embodiment provides a sensor package comprising: a multilayer substrate comprising a mold compound layer and a plurality of patterned metal layers; an embedded die embedded in the multilayer substrate, wherein the mold compound layer of the multilayer substrate surrounds the embedded die; and, a sensing element disposed over the multilayer substrate, the sensing element comprising a first patterned metal layer electrically connected to the embedded die through the multilayer substrate.

Another embodiment provides a method of forming a sensor package. The method comprises: forming a multilayer substrate, wherein the multilayer substrate comprises a mold compound layer and a plurality of patterned metal layers; embedding a die in the multilayer substrate, wherein the mold compound layer of the multilayer substrate surrounds the die; and, forming a sensing element disposed over the multilayer substrate, wherein the sensing element comprises a first patterned metal layer electrically connected to the embedded die through the multilayer substrate.

BRIEF DESCRIPTION OF THE DRAWINGS

The preferred exemplary embodiments of the present disclosure will hereinafter be described in conjunction with the appended drawings, where like designations denote like elements, and.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, summary, brief description of the drawings, the following detailed description, or the appended drawings.

Among other things, some embodiments disclosed herein provide a new way to manufacture a high performance fingerprint sensor at low cost. Some embodiments also solve a warpage or warping problem that is intrinsic to existing package processes. In some embodiments, two different processing technologies are combined together: substrate manufacturing technologies that use mold compounds to achieve low cost, and wafer level packaging technologies that have advanced line/space and small via processes to achieve high performance for sensing.

Figure 1:
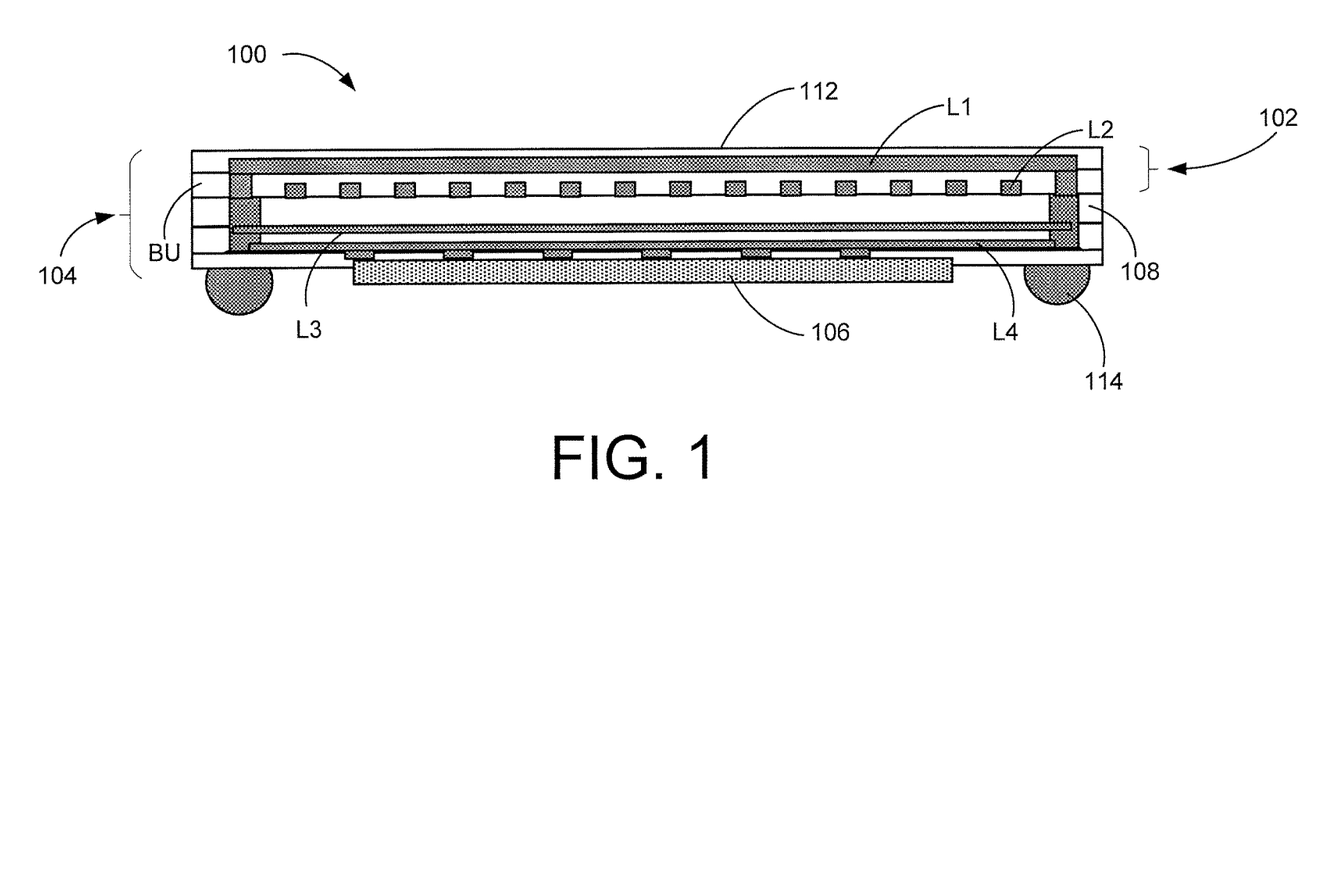
FIG. 1 depicts an example fingerprint sensor package.

Turning now to the figures, FIG. 1 depicts one example fingerprint sensor package 100. In the example fingerprint sensor package 100 of FIG. 1, sensing element 102 is manufactured with a substrate 104 using a substrate process. A silicon (Si) die 106 is attached onto the substrate 104 after substrate formation and patterning. Referring to FIG. 1, the substrate 104 comprises layers L1, L2, L3, and L4, and includes a substrate core 108 and one or more buildup layers (BU) on the substrate core 108. The sensing element 102 is formed in L1 and L2. The fingerprint sensor package 100 shown in FIG. 1 also includes a top layer 112 and solder balls 114. There are some drawbacks to the fingerprint sensor package 100 of FIG. 1. For one, the minimum feature size of the substrate process, e.g., the minimum trace width, the trace spacing, the via size, and/or the dielectric thickness, does not go small enough for some desirable sensing element geometries that would improve sensing performance. For another, the intrinsic warpage of the package makes the module making process very challenging and, in some cases, affects the fingerprint images.

Figure 2:
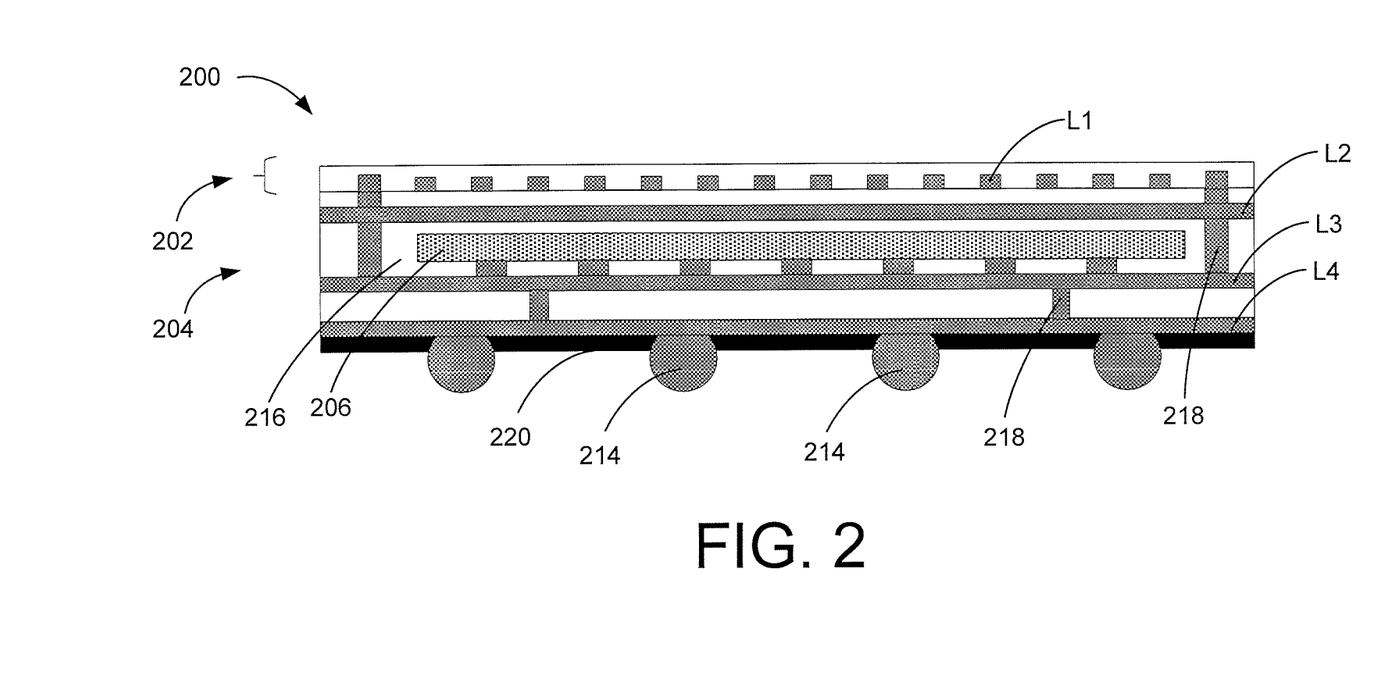
FIG. 2 depicts another example fingerprint sensor package, according to some embodiments.

Referring to FIG. 2, another example fingerprint sensor package 200 is depicted, according to some embodiments. In the example fingerprint sensor package 200 shown in FIG. 2, an embedded die 206 is embedded in a multilayer substrate 204. The embedded die 206 is embedded in a mold compound layer 216, which surrounds the embedded die 206. In particular, the mold compound layer 216 may be disposed in a peripheral area around the embedded die 206, and a portion of the mold compound layer 216 may optionally also be disposed in an area overlapping the embedded die 206 (i.e., within the die area) above and/or below the embedded die 206. The multilayer substrate 204 also includes a plurality of patterned metal layers L2, L3, and L4, although in various embodiments, more or fewer patterned metal layers may be included in the multilayer substrate 204.

In the example fingerprint sensor package 200, a sensing element 202 (or "detector" element) is formed over the multilayer substrate 204 using a different processing technology or the same processing technology as the various layers of the multilayer substrate 204. The sensing element 202 that is formed over the multilayer substrate 204 may be formed directly on a surface of the multilayer substrate 204 or formed on the multilayer substrate through one or more intervening layers. The sensing element 202 includes a patterned metal layer L1 electrically connected to the embedded die 206 through intermediate layers of the multilayer substrate 204, e.g., using vias 218 extending through the multilayer substrate 204 and routing traces provided in the patterned metal layers of the multilayer substrate 204. The sensing element 202 may be formed of passive traces provided in the patterned metal layer L1 and a dielectric material separating traces in the patterned metal layer L1. Preferably, the patterned metal layer L1 forms an array of capacitive sensing electrodes arranged in a regular or irregular array pattern that is dimensioned to sense a fingerprint (e.g., capture a capacitive fingerprint), although other sensing technologies such as resistive and inductive sensing technologies utilizing passive circuit components are possible. In FIG. 2, the sensing element 202 is shown as including a single patterned metal layer L1, but it should be understood that the sensing element 202 may include a single patterned metal layer or multiple patterned metal layers, in various embodiments. For example, it is possible to form either a linear swipe sensor array or a two dimensional array using a single patterned metal layer, and it is also possible to form either a linear swipe sensor array or a two dimensional array using multiple patterned metal layers, in various embodiments.

The example fingerprint sensor package 200 also includes a plurality of interconnection components 214 disposed on an opposite side of the multilayer substrate 204 to the sensing element 202. The interconnection components 214 shown in FIG. 2 include a plurality of solder balls, e.g., ball grid array (BGA) balls, but in various embodiments, other interconnection components may be used, such as land grid array (LGA) pads. The interconnection components 214 provide contacts for connecting the fingerprint sensor package 200 to external components, e.g., for mounting to a circuit board that may be flexible or rigid, or possibly mounting to another chip package. A solder resist 220 is also provided on the interconnection side (i.e., bottom side in FIG. 2) of the package to provide protection and separate the individual interconnection components 214. For fingerprint sensors, it is helpful to position the interconnection components 214 on an opposite side of the multilayer substrate 204 from the sensing element 202, as this avoids having the interconnection components 214 interfere with the fingerprint capture, and this also allows the sensing distance between the sensing element 202 and the finger to be sensed to be reduced without increasing an area dimension of the package. However, it should be understood that this arrangement is not a strict requirement. For example, it is possible to use alternate configurations where the interconnection components 214 are arranged side by side with the sensing element 202 (e.g., on the same side as the sensing element 202 in an area next to the sensing element 202). Such an arrangement may increase an area dimension but possibly allow for a reduced number of layers or provide for an even thinner form factor package.

In the example fingerprint sensor package 200 shown in FIG. 2, the embedded die 206 is an integrated circuit (IC) that may provide logic and active circuitry for controlling and/or operating the sensor, and the embedded die 206 may include drive circuitry and/or receive circuitry for transmitting electrical signals and/or measuring electrical signals from the sensing element 202, respectively. The embedded die 206 may be formed from a silicon die or other semiconductor die. The embedded die 206 is connected to the sensing element 202 and the interconnection components 214 through the patterned metal layers L2, L3, and L4 of the multilayer substrate 204 and the vias 218 extending through the intermediate layers of the multilayer substrate 204. In various embodiments, the patterned metal layers may include copper (Cu), aluminum (Al), and/or other suitable metal materials. Since the embedded die 206 is embedded in a multilayer substrate 204 that includes a plurality of patterned metal layers, the interconnection components 214 can be arranged in an area overlapping the die area (although they do not have to be), as shown in FIG. 2, using routing traces within the patterned layers of the multilayer substrate, unlike the example shown in FIG. 1, in which the solder balls 114 need to be arranged outside of the die area in an area around the die to accommodate the die attachment to the bottom side of the substrate. This allows for more flexibility in arranging a grid pattern or lead count for interconnecting the package.

Figure 3:
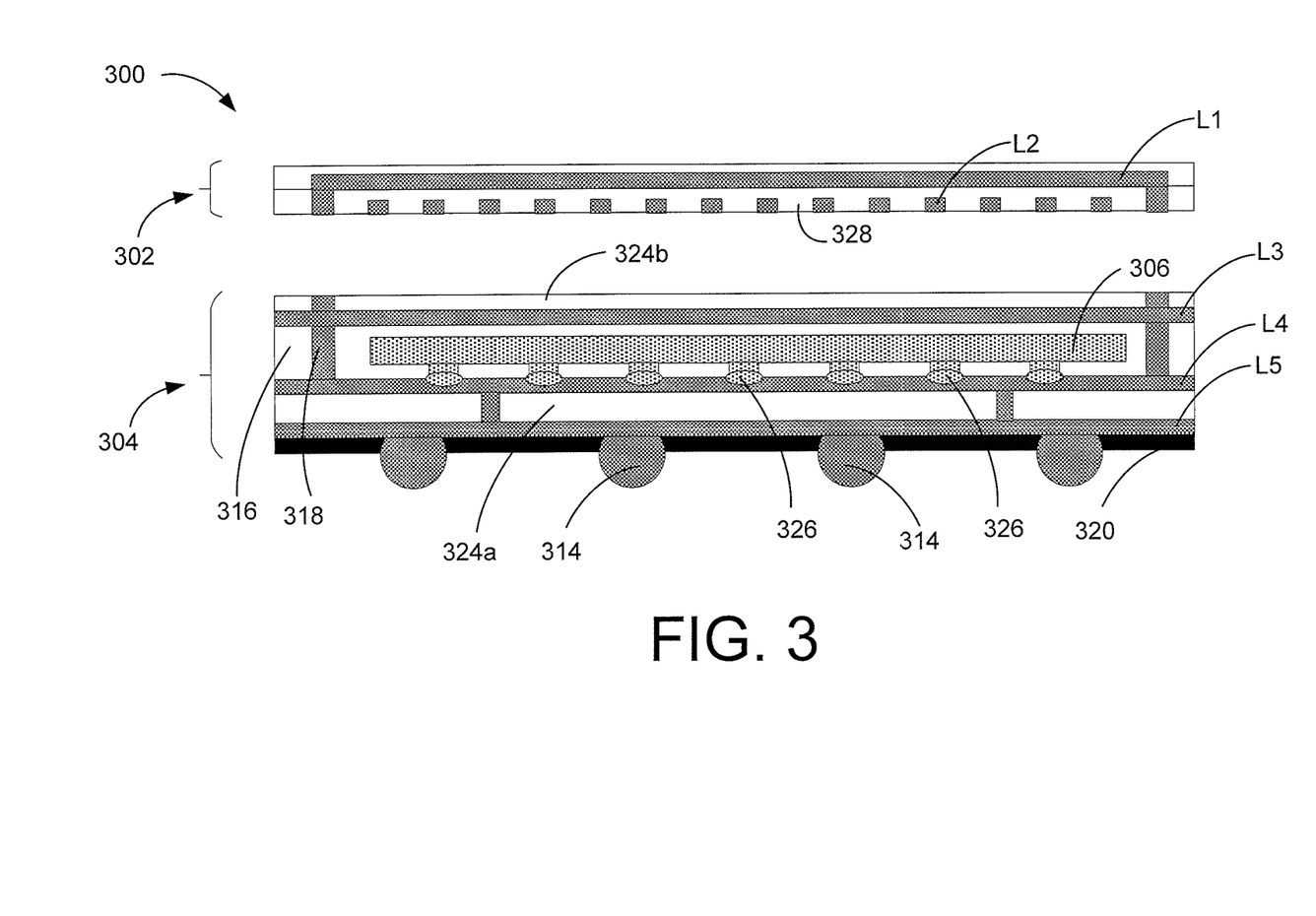
FIG. 3 depicts an example hybrid build-up fingerprint sensor package, according to some embodiments.

Turning now to FIG. 3, another example fingerprint sensor package 300 is depicted, according to some embodiments. The example fingerprint sensor package 300 depicted in FIG. 3 separates the sensing element 302 from the substrate process that is used for the multilayer substrate 304 and makes the sensing element with wafer level packaging processing technologies, e.g., redistribution layer (RDL) processing technologies, different from the substrate processing technologies used for the multilayer substrate 304. The sensing element 304 is shown separated from the multilayer substrate 304 in FIG. 3 for purposes of illustration, but it will be understood that the sensor element 304 will be positioned on the multilayer substrate 304 in the final package, and can be formed by building up the sensor element layers on the multilayer substrate 304 during processing.

Referring to FIG. 3, the sensing element 302 is formed using patterned metal layers L1 and L2, which are separate from the patterned metal layers L3, L4, and L5 of the multilayer substrate 304. Vias 318 included in the multilayer substrate 304 are used to electrically connect the patterned metal layers L1 and L2 of the sensing element 302 to the embedded die 306. The sensing element 302 has a lower minimum feature size than layers of the multilayer substrate 304. For example, wafer level processing technology can be used to make the sensing element layers with capabilities to achieve small vias in L1 and L2 (e.g., less than 15 um), thin dielectric layers between the patterned metal layers L1 and L2 (e.g., about 5 um), and thin copper (Cu) thickness for the traces (e.g., about 3 um) in the patterned metal layers. Substrate layers L3, L4, and L5 can be made with substrate processing technology plus assembly steps.

The multilayer substrate 304 of FIG. 3 may be a laminate substrate having an epoxy mold compound (EMC) for the mold compound layer 316 that embeds the embedded die 306. The multilayer molded substrate has a plurality of patterned metal layers L3, L4, and L5 that can have different patterns, and may be used for routing, shielding, and/or other purposes, where these patterns can tolerate larger feature sizes than the sensor element layers L1 and L2. While three substrate layers are used in this embodiment (corresponding to three different metal layers that may have three different conductive patterns), different numbers of layers may be used for the substrate in different implementations. The multilayer substrate 304 includes multiple dielectric layers between the various patterned metal layers. The dielectric layers of the multilayer substrate 304 include the mold compound layer 316 and other dielectric layers 324a, 324b, which can be build-up layers that are also formed of a mold compound, or they can be formed of other materials, such as epoxy resins, ajinomoto build-up films (ABF), and the like.

In the example fingerprint sensor package 300 shown in FIG. 3, the embedded die 306 is attached to an intermediate layer of the multilayer substrate 304 using die bumps 326. In particular, the embedded die 306 is attached the patterned metal layer L4 with the front side of the die facing away from the sensing element 304 (i.e., face down in FIG. 3) and facing towards the interconnection side of the package, using flip chip reflow with a bumped die. The back side of the die (opposite to the front side of the die), faces the sensing element 304. The embedded die 306 is positioned over the dielectric layer 324a of the multilayer substrate 304, and the patterned metal layers L4 and L5 and conductive vias extending through the dielectric layer 324a are used to electrically connect the embedded die 306 to the interconnection components 314 on the side of the package opposite to the sensing element 302. The patterned metal layers L4 and/or L5 also allow the interconnection components to be distributed within an area overlapping the embedded die 306, as appropriate, while the dielectric layer 324a separates the embedded die from the interconnection components 314 and patterned metal layer L5. The multilayer substrate 304 also includes a patterned metal layer L3 on an opposite (or opposing) side of the embedded die 306 to the patterned metal layers L4 and L5. The patterned metal layer L3 may include shielding between the embedded die 306 and the sensing element 302, and the shielding in the patterned metal layer L3 can be electrically connected one or more of the interconnection components 314 in order to connect the shielding to ground or another fixed potential. The multilayer substrate 304 also includes a dielectric layer 324b on an opposite side of the embedded die 306 from the dielectric layer 324a, which separates the patterned metal layer L3 of the multilayer substrate 304 from the sensing element 302.

In the FIG. 3, the sensing element 302 may be formed of an array of metal electrodes in the patterned metal layers L1 and L2 forming a capacitive sensing array. For example, the patterned metal layers L1 and L2 may form a two-dimensional array of transmitter electrodes (or "drive lines") that are capacitively coupled to receiver electrodes (or "pickup lines") that can detect ridges and valleys of a fingerprint over the array based on a change in capacitive coupling between the transmitter electrodes and the receiver electrodes. The two-dimensional array may be formed by rows of electrodes in the patterned metal layer of L1, and overlapping columns of electrodes in the patterned metal layer of L2 that are insulated from the rows of electrodes in L1 by a thin film dielectric layer 328. Preferably, the sensor electrodes in the patterned metal layer L1 include receiver electrodes and the sensor electrodes in the patterned metal layer L2 include transmitter electrodes, but this can be reversed and other patterns and arrangements are possible. The embedded die 306 embedded in the multilayer substrate 304 can include circuitry associated with operation of the same. For example, the embedded die 306 may include transmitter circuitry for driving sensing signals onto the transmitter electrodes of the sensing element 302 and receiver circuitry for processing resulting signals received from the receiver electrodes of the sensing element 302.

Figure 4A:
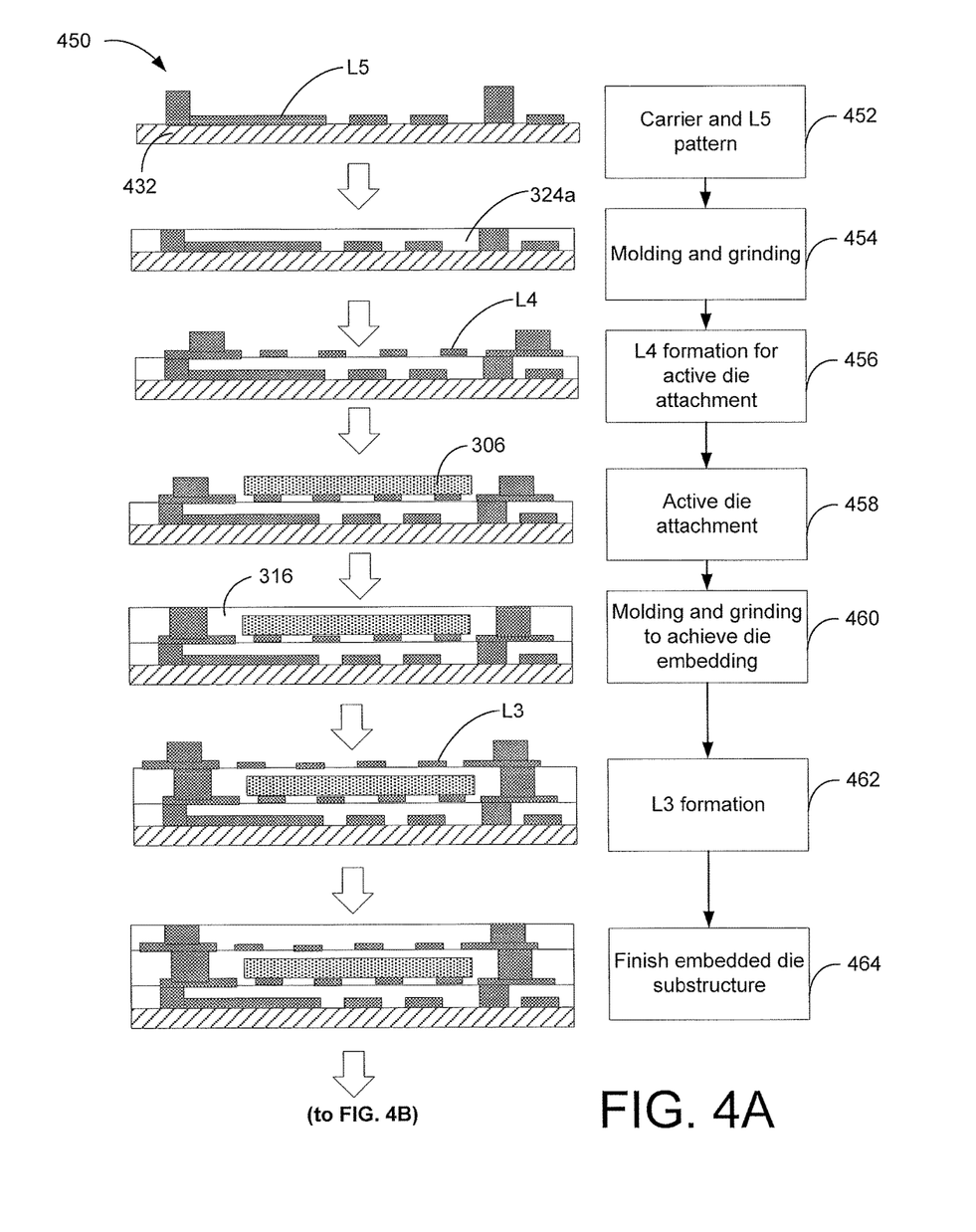
FIGS. 4A-4B depict an example process flow for forming a hybrid build-up fingerprint sensor package, according to some embodiments.
Figure 4B:
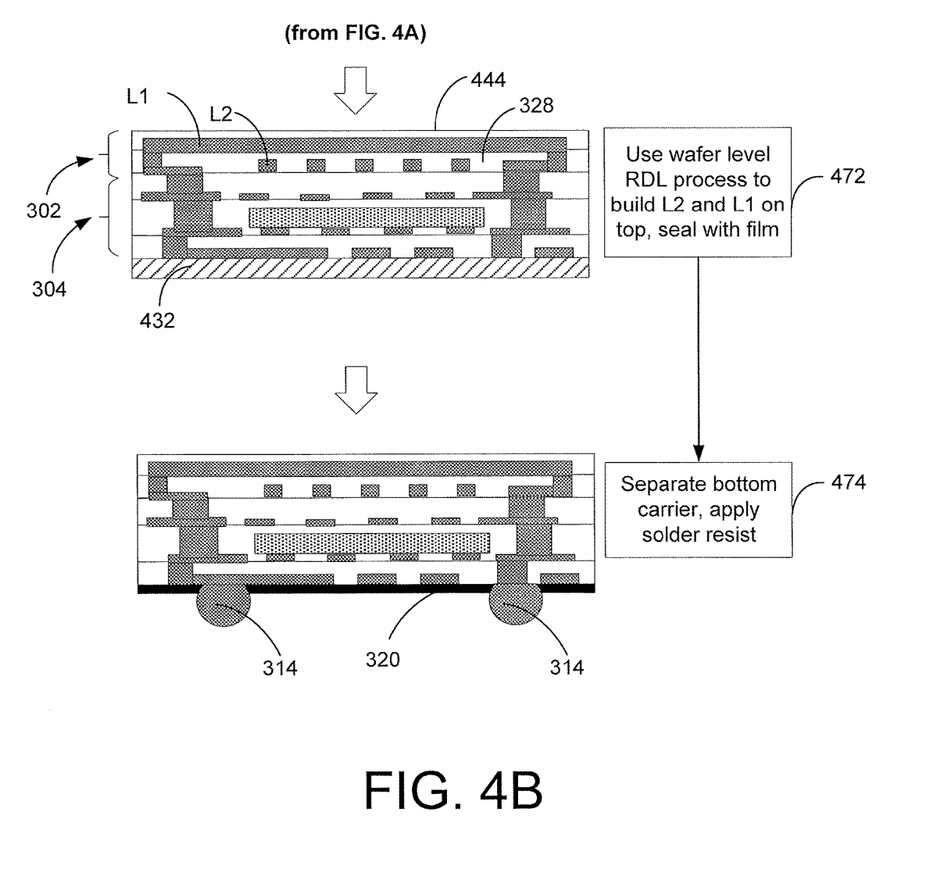

FIGS. 4A-4B depict an example process flow 450 for making the fingerprint sensor package 300 shown in FIG. 3, according to some embodiments. In the example shown in FIGS. 4A-4B, the sensing element 302 is formed using a separate wafer level process from the substrate process used for the substrate layers, with FIG. 4A depicting build-up substrate processing steps for forming the multilayer laminate substrate and embedding the die, and FIG. 4B depicting wafer level processing steps for forming the sensing element. In the example process flow 450 depicted in FIGS. 4A-4B, a surface mount technology (SMT) process is also used to attached the die to the multilayer substrate 304.

As shown in FIG. 4A, at step 452, a patterned metal layer L5 is formed over a carrier substrate 432. The patterned metal layer L5 may be formed using a suitable photosensitive material to form the desired pattern for L5, then exposing and plating the pattern with a suitable metal. At step 454, a dielectric layer 324a is formed over the carrier substrate 432 and over the patterned metal layer L5. The dielectric layer 324a is formed using a molding and grinding process to achieve the desired dielectric layer thickness, although other suitable build-up layers may be used, e.g., the dielectric layer 324a may use a mold compound or another suitable dielectric sheet. At step 456, another patterned metal layer L4 is formed over the build-up dielectric layer 324a, e.g., in a similar fashion to formation of the patterned metal layer L5. The patterned metal layer L4 contains a pattern for attachment of the die, and may include routing traces connecting die pads within the die area to vias in an area outside of the die area that extend through the build-up layer 324a and providing electrical signals to external devices to the package through one or more of the interconnection components 314. At step 458, the die is attached face to the patterned metal layer L4 over the build-up layer 324a. Attachment of the die 306 may be accomplished using a flip chip die bonding process. At step 460, the mold compound layer 316 is formed around the embedded die 306 to embed the die in the multi-layer substrate. This may be achieved using a compression molding process, and the molding layer may be ground down. In FIG. 4A, the mold compound layer 316 is ground down to leave behind a portion of the mold compound layer 316 in an area overlapping the embedded die 306; however, in various embodiments it is possible to grind the mold compound layer 316 down further to expose the die and remove this portion of the mold compound. At step 462, another patterned metal layer L3 is formed over the mold compound layer 316 and over the embedded die 306. The patterned metal layer L3 may optionally include a ground shielding layer and/or routing for connecting to a sensor pattern in the later formed sensing element layers, as appropriate. At step 464, the multilayer substrate with embedded die substructure is completed, which may involve formation of another dielectric layer over the patterned metal layer L3, using another build-up laminate layer.

In various embodiments, the substrate processing steps 452-464 may optionally be performed on a panel (or strip) format substrate larger than a typical wafer, for high volume and cost-effective processing. If so, after finishing the embedded die substructure at step 464, the method 450 may involve singulating the substrate into a plurality of smaller wafer format substrates, e.g., round 12 inch wafer formats, for processing in a wafer fab facility. Then, the method 450 may proceed to the wafer level processing steps shown in FIG. 4B.

As shown in FIG. 4B, at step 472, the sensing element 302 is formed over the multilayer substrate 304 using wafer level RDL processing steps to build-up layers of the sensing element 302. For example, this may involve formation of the patterned metal layer L2, followed by spin coating to form a thin film dielectric layer 328 over the patterned metal layer L2, followed by formation of the patterned metal layer L1 over the thin film dielectric layer 328.

The sensing element 302 may also be sealed with a film 444 or other top layer at this step. At step 474, the carrier substrate 432 (bottom carrier) is removed from the interconnection side of the multilayer substrate 304. Also, solder balls or other interconnection components 314 and solder resist 320 may be applied at this stage, which may optionally be reflowed into finished LGA pads or used as BGA balls. The layers of the sensing element 302 formed using wafer level processing technologies may have lower minimum feature size than layers of the multilayer substrate 304, including feature sizes such as metal trace width, metal trace spacing, dielectric layer thickness, via size, or a combination thereof. This may achieve improved sensing element performance while maintaining lower cost for other layers with lower feature size designs. Thus, a high performance and low cost overall sensor package may be achieved.

Figure 5:
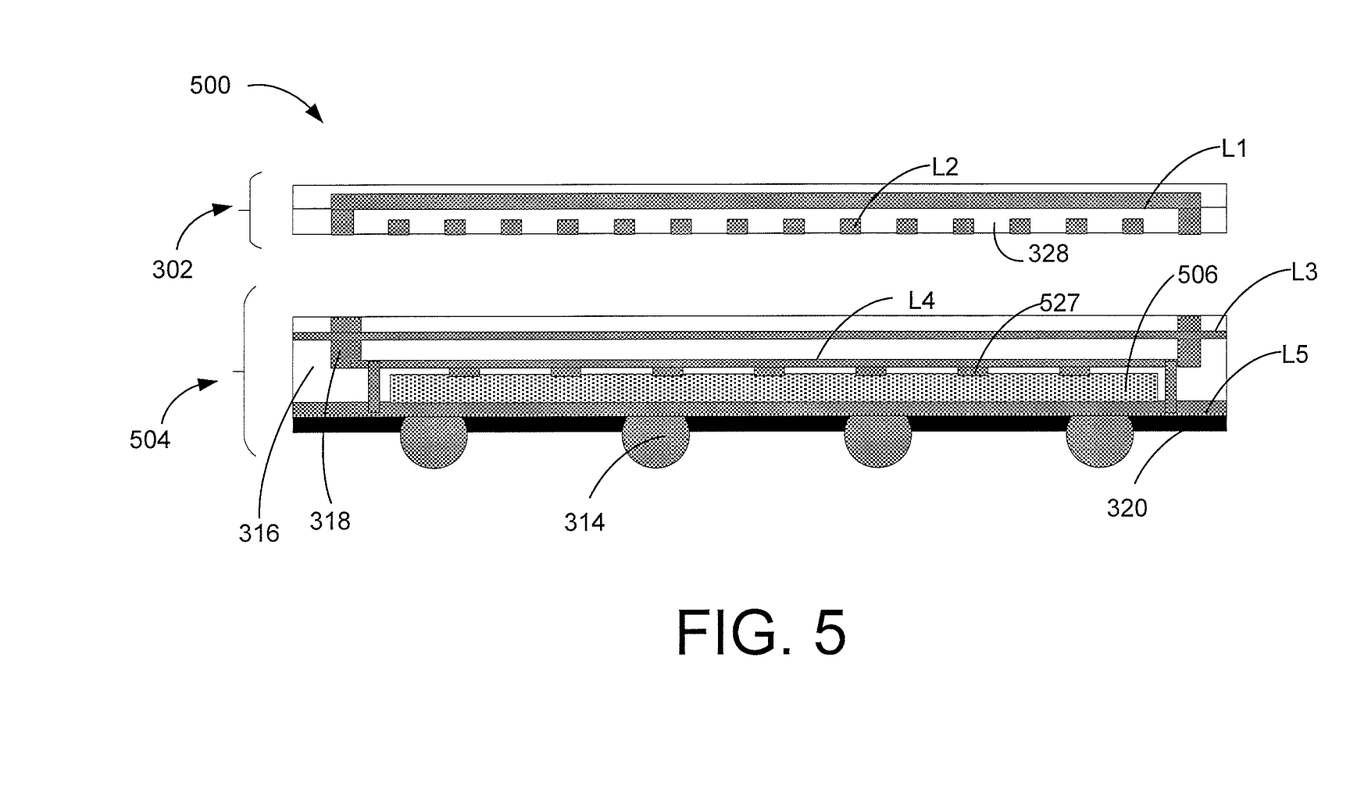
FIG. 5 depicts another example hybrid build-up fingerprint sensor package, according to some embodiments.
Figure 6A:
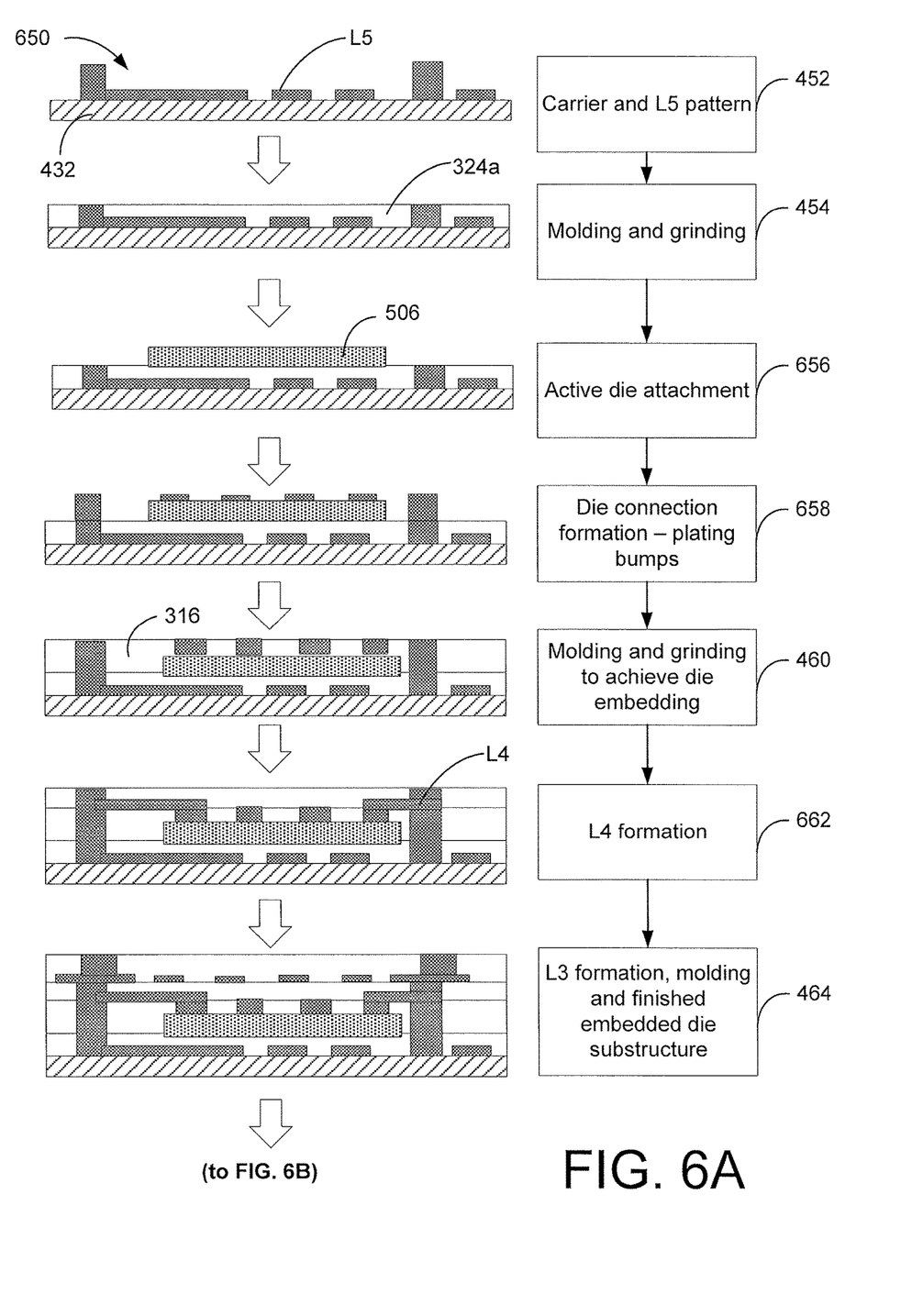
FIGS. 6A-6B depicts another example process flow for forming a hybrid build-up fingerprint sensor package, according to some embodiments.
Figure 6B:
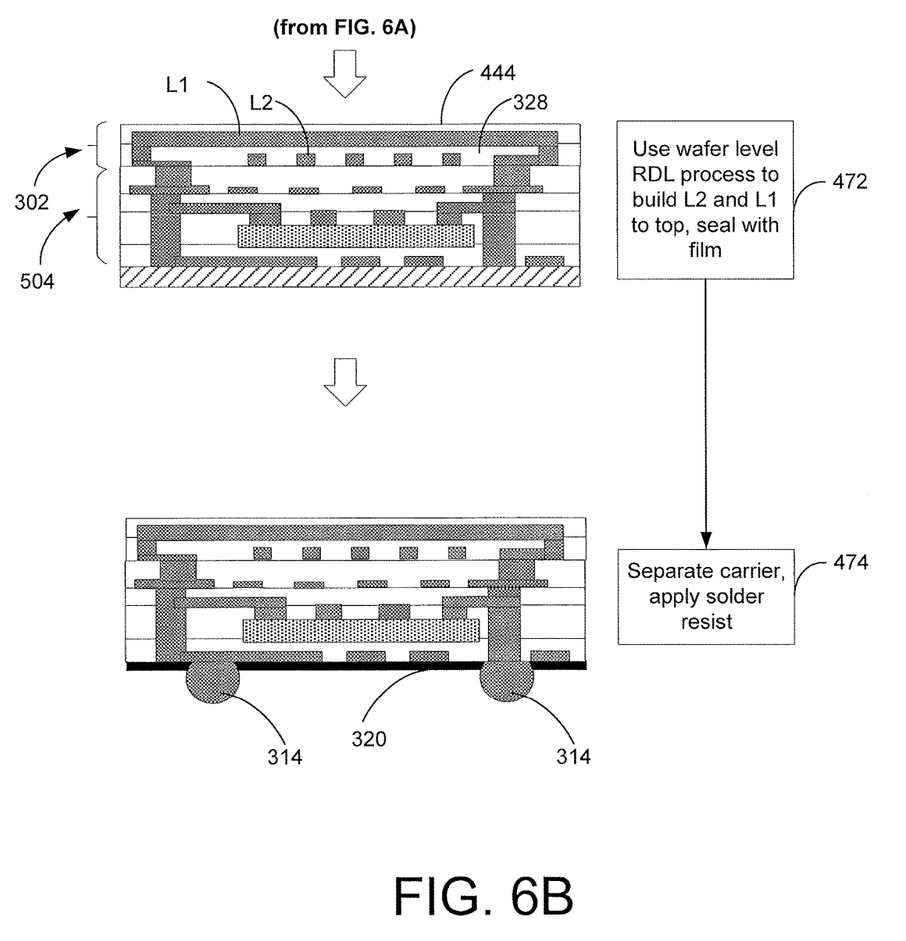

Turning now to FIG. 5, another example fingerprint sensor package 500 is depicted, according to some embodiments. Also, FIGS. 6A-6B depict another example process flow 650 for forming the example fingerprint sensor package 500, according to some embodiments. In FIGS. 5-6B, like elements are labeled with like reference numerals as FIGS. 3-4B for simplicity in explanation.

Referring to FIG. 5, example fingerprint sensor package 500 differs from the example fingerprint sensor package 300 shown in FIG. 3 in some respects. For one, the embedded die 506 is embedded in the multilayer substrate 504 facing the sensing element 302 (i.e., facing up in FIG. 5). Also, the patterned metal layer L3 that forms the die connection pattern is disposed above the embedded die 506, between the sensing element 302 and the embedded die 506, compared to the example fingerprint sensor package 300, which has the die connection pattern L3 disposed below the embedded die 506, between the interconnection components 314 and the embedded die 506. The embedded die 506 may be connected to the patterned metal layer L3 using plating bumps 527 on the front side of the die.

Referring to FIGS. 6A-6B, the example process flow 650 differs from the example process flow 450 of FIGS. 4A-4B in some respects. For one, at step 656, the die 506 is attached to the substrate over the carrier substrate 432 and over the lower build-up layer 324*a* using a non-SMT process, unlike FIG. 4A in which, at step 456, the die is attached to the lower build-up layer 324*a* and the metal pattern L4 using an SMT process. Also, at step 658, the die connection is formed over the attached die. At step 662, the patterned metal layer L4 is formed over the mold compound layer 316 and over the embedded die 506.

While the above embodiments have been described with reference to fingerprint sensors, the package technology described above may be used to form other sensors, such as other types of biometric sensors or other types of capacitive sensors configured to detect other input objects. Also, embodiments of this invention are not limited to sensor packages, but can be used for other types of packages. For example, devices and processes similar to those described above can be used for package on package configuration, which is currently often used for manufacturing mobile device central processing units (CPUs). In these embodiments, the sensing element can be replaced with other layers in which the metal patterns have lower minimum feature sizes than the other layers of the multilayer substrate. Moreover, embodiments of this invention can be used in another type of semiconductor package where thinner packaging is desired.

Thus, the embodiments and examples set forth herein are presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A sensor package, comprising:
   a multilayer substrate comprising an embedded die, a mold compound layer, and a plurality of patterned metal layers, wherein the embedded die is embedded in the multilayer substrate, and wherein the mold compound layer of the multilayer substrate surrounds the embedded die; and
   a sensing element disposed over the multilayer substrate, the sensing element comprising a first patterned metal layer electrically connected to the embedded die through the multilayer substrate wherein the multilayer substrate further comprises a front side facing the sensing element, a back side opposite to the front side, and a plurality of interconnection components disposed on the back side of the multilayer substrate, wherein the plurality of patterned metal layers of the multilayer substrate comprises a second patterned metal layer and a third patterned metal layer, wherein the second patterned metal layer and the third patterned metal layer are disposed on opposing sides of the embedded die, wherein the second patterned metal layer of the multilayer substrate comprises shielding disposed between the embedded die and the sensing element, wherein the shielding is connected to ground or another fixed potential, and wherein the third patterned metal layer comprises a routing trace electrically connected to one of the interconnection components, wherein the one of the interconnection components is disposed within an area overlapping the embedded die.

2. The sensor package of claim 1, wherein the first patterned metal layer comprises a plurality of capacitive sensing electrodes dimensioned to sense a fingerprint.

3. The sensor package of claim 1, wherein the sensing element further comprises:
   a fourth patterned metal layer electrically connected to the embedded die through the multilayer substrate; and
   a thin film dielectric layer disposed between the first patterned metal layer and the fourth patterned metal layer.

4. The sensor package of claim 3, wherein the first patterned metal layer comprises a plurality of transmitter electrodes and the fourth patterned metal layer comprises a plurality of receiver electrodes.

5. The sensor package of claim 1, wherein the embedded die comprises a front side and a back side opposite to the front side, wherein the back side of the embedded die faces the sensing element.

6. The sensor package of claim 1, wherein the embedded die comprises a front side and a back side opposite to the front side, wherein the front side of the embedded die faces the sensing element.

7. The sensor package of claim 6, wherein the plurality of patterned metal layers of the multilayer substrate comprises a fourth patterned metal layer, wherein the front side of the embedded die is attached to the fourth patterned metal layer with a plurality of die bumps.

8. The sensor package of claim 1, wherein the sensing element has a lower minimum feature size than the multilayer substrate.

9. The sensor package of claim 8, wherein the first patterned metal layer of the sensing element has at least one of a lower minimum trace width, a lower minimum trace spacing, and a lower minimum via size than the plurality of patterned metal layers of the multilayer substrate.

10. The sensor package of claim 1, wherein the plurality of interconnection components comprise at least one of a plurality of solder balls and a plurality of land grid array (LGA) pads.

11. The sensor package of claim 1, wherein the multilayer substrate comprises a build up layer between the mold compound layer and the sensing element.

12. The sensor package of claim 1, wherein the multilayer substrate is a laminate substrate.

13. A method of forming a sensor package, the method comprising:
forming a multilayer substrate, wherein the multilayer substrate comprises a mold compound layer and a plurality of patterned metal layers;
providing an embedded die, wherein the embedded die is embedded in the multilayer substrate, wherein the mold compound layer of the multilayer substrate surrounds the embedded die; and
forming a sensing element, wherein the sensing element is disposed over the multilayer substrate, the sensing element comprising a first patterned metal layer electrically connected to the embedded die through the multilayer substrate wherein the multilayer substrate further comprises a front side facing the sensing element, a back side opposite to the front side, and a plurality of interconnection components disposed on the back side of the multilayer substrate, wherein the plurality of patterned metal layers of the multilayer substrate comprises a second patterned metal layer and a third patterned metal layer, wherein the second patterned metal layer and the third patterned metal layer are disposed on opposing sides of the embedded die, wherein the second patterned metal layer of the multilayer substrate comprises shielding disposed between the embedded die and the sensing element, wherein the shielding is connected to ground or another fixed potential, and wherein the third patterned metal layer comprises a routing trace electrically connected to one of the interconnection components, wherein the one of the interconnection components is disposed within an area overlapping the embedded die.

14. The method of claim 13, wherein the first patterned metal layer comprises a plurality of capacitive sensing electrodes dimensioned to sense a fingerprint.

15. The method of claim 13, wherein the sensing element further comprises:
a fourth patterned metal layer electrically connected to the embedded die through the multilayer substrate; and
a thin film dielectric layer disposed between the first patterned metal layer and the fourth patterned metal layer.

16. The method of claim 15, wherein the first patterned metal layer comprises a plurality of transmitter electrodes and the fourth patterned metal layer comprises a plurality of receiver electrodes.

17. The method of claim 13, wherein the sensing element has a lower minimum feature size than the multilayer substrate.

* * * * *